United States Patent
Takatori et al.

(10) Patent No.: US 7,188,135 B2
(45) Date of Patent: Mar. 6, 2007

(54) ANALOG ADAPTIVE FIR FILTER HAVING INDEPENDENT COEFFICIENT SETS FOR EACH FILTER TAP

(75) Inventors: Hiroshi Takatori, Sacramento, CA (US); James Little, Sacramento, CA (US); Susumu Hara, Austin, TX (US)

(73) Assignee: KeyEye Communications, Sacramento, CA (US)

( * ) Notice: Subject to any disclaimer, the term of this patent is extended or adjusted under 35 U.S.C. 154(b) by 352 days.

(21) Appl. No.: 10/944,470

(22) Filed: Sep. 16, 2004

(65) Prior Publication Data

US 2005/0094722 A1    May 5, 2005

Related U.S. Application Data

(60) Provisional application No. 60/508,548, filed on Oct. 2, 2003.

(51) Int. Cl.
*G06G 7/02* (2006.01)
*G06F 17/10* (2006.01)

(52) U.S. Cl. .............. 708/819; 708/319; 708/316
(58) Field of Classification Search ............... 708/819, 708/316, 319
See application file for complete search history.

(56) References Cited

U.S. PATENT DOCUMENTS

| | | | |
|---|---|---|---|
| 4,475,170 A | 10/1984 | Haque | 364/825 |
| 5,166,895 A * | 11/1992 | Makino | 708/319 |
| 5,414,311 A | 5/1995 | Carley | 327/94 |
| 5,563,819 A | 10/1996 | Nelson | 364/825 |
| 5,931,898 A | 8/1999 | Khoury | 708/819 |
| 6,032,171 A | 2/2000 | Kiriaki et al. | 708/819 |
| 6,035,320 A | 3/2000 | Kiriaki et al. | 708/819 |
| 6,529,926 B1 | 3/2003 | Capofreddi | 708/316 |
| 6,553,398 B2 | 4/2003 | Capofreddi | 708/319 |

OTHER PUBLICATIONS

Michael Q. Le et al., "An Adaptive Analog Noise-Predictive Decision-Feedback Equalizer," IEEE Journal of Solid-State Circuits, vol. 37, No. 2, Feb. 2002, pp. 105-113.
Xiaodong Wang, "A Low-Power 170-MHz Discrete-Time Analog FIR Filter," IEEE Journal of Solid-State Circuits, vol. 33, No. 3, Mar. 1998, pp. 417-426.

* cited by examiner

*Primary Examiner*—Tan V. Mai
(74) *Attorney, Agent, or Firm*—Lumen Intellectual Property Services, Inc.

(57) ABSTRACT

A finite impulse response filter having tap weight rotation is provided, where each tap has a corresponding coefficient selector. Each coefficient selector includes N coefficients, where N is the number of taps. Each coefficient selector provides one of its corresponding coefficients as an input to a multiplier. Each multiplier also receives an input from a triggered track and hold tap. The tap coefficients are selected according to the time delay since the corresponding track and hold tap was most recently triggered. In this manner, the tendency of multiplier gain nonuniformity to degrade filter operation in the presence of tap weight rotation is reduced. In another embodiment, an offset selector is provided, to reduce the tendency of component offsets to degrade filter operation in the presence of tap weight rotation.

18 Claims, 6 Drawing Sheets

| t | φ₁ | φ₂ | φ₃ | Y₁ | Y₂ | Y₃ | X₁ | X₂ | X₃ | X₁Y₁ + X₂Y₂ + X₃Y₃ |
|---|----|----|----|------|------|------|----|----|----|---------------------|
| 1 | H | L | L | x(1) | | | | | | |
| 2 | L | H | L | x(1) | x(2) | | | | | |
| 3 | L | L | H | x(1) | x(2) | x(3) | C₃ | C₂ | C₁ | C₁x(t) + C₂x(t−1) + C₃x(t−2) |
| 4 | H | L | L | x(4) | x(2) | x(3) | C₁ | C₃ | C₂ | " |
| 5 | L | H | L | x(4) | x(5) | x(3) | C₂ | C₁ | C₃ | " |
| 6 | L | L | H | x(4) | x(5) | x(6) | C₃ | C₂ | C₁ | " |
| 7 | H | L | L | x(7) | x(5) | x(6) | C₁ | C₃ | C₂ | " |
| 8 | L | H | L | x(7) | x(8) | x(6) | C₂ | C₁ | C₃ | " |
| 9 | L | L | H | x(7) | x(8) | x(9) | C₃ | C₂ | C₁ | " |

| t | φ₁ | φ₂ | φ₃ | Y₁ | Y₂ | Y₃ | X₁ | X₂ | X₃ | X₁Y₁ + X₂Y₂ + X₃Y₃ |
|---|----|----|----|------|------|------|------|------|------|---------------------|
| 1 | H | L | L | x(1) | | | | | | |
| 2 | L | H | L | x(1) | x(2) | | | | | |
| 3 | L | L | H | x(1) | x(2) | x(3) | $A_3$ | $B_2$ | $C_1$ | $C_1 x(t) + B_2 x(t-1) + A_3 x(t-2)$ |
| 4 | H | L | L | x(4) | x(2) | x(3) | $A_1$ | $B_3$ | $C_2$ | $A_1 x(t) + C_2 x(t-1) + B_3 x(t-2)$ |
| 5 | L | H | L | x(4) | x(5) | x(3) | $A_2$ | $B_1$ | $C_3$ | $B_1 x(t) + A_2 x(t-1) + C_3 x(t-2)$ |
| 6 | L | L | H | x(4) | x(5) | x(6) | $A_3$ | $B_2$ | $C_1$ | $C_1 x(t) + B_2 x(t-1) + A_3 x(t-2)$ |
| 7 | H | L | L | x(7) | x(5) | x(6) | $A_1$ | $B_3$ | $C_2$ | $A_1 x(t) + C_2 x(t-1) + B_3 x(t-2)$ |
| 8 | L | H | L | x(7) | x(8) | x(6) | $A_2$ | $B_1$ | $C_3$ | $B_1 x(t) + A_2 x(t-1) + C_3 x(t-2)$ |
| 9 | L | L | H | x(7) | x(8) | x(9) | $A_3$ | $B_2$ | $C_1$ | $C_1 x(t) + B_2 x(t-1) + A_3 x(t-2)$ |

Fig. 5

| t | φ$_1$ | φ$_2$ | φ$_3$ | Y$_1$ | Y$_2$ | Y$_3$ | X$_1$ | X$_2$ | X$_3$ | X$_1$Y$_1$ + X$_2$Y$_2$ + X$_3$Y$_3$ |
|---|---|---|---|---|---|---|---|---|---|---|
| 1 | H | L | L | x(1) | | | | | | |
| 2 | L | H | L | x(1) | x(2) | | | | | |
| 3 | L | L | H | x(1) | x(2) | x(3) | A$_3$ | B$_2$ | C$_1$ | C$_1$x(t) + B$_2$x(t-1) + A$_3$x(t-2) + O$_3$ |
| 4 | H | L | L | x(4) | x(2) | x(3) | A$_1$ | B$_3$ | C$_2$ | A$_1$x(t) + C$_2$x(t-1) + B$_3$x(t-2) + O$_1$ |
| 5 | L | H | L | x(4) | x(5) | x(3) | A$_2$ | B$_1$ | C$_3$ | B$_1$x(t) + A$_2$x(t-1) + C$_3$x(t-2) + O$_2$ |
| 6 | L | L | H | x(4) | x(5) | x(6) | A$_3$ | B$_2$ | C$_1$ | C$_1$x(t) + B$_2$x(t-1) + A$_3$x(t-2) + O$_3$ |
| 7 | H | L | L | x(7) | x(5) | x(6) | A$_1$ | B$_3$ | C$_2$ | A$_1$x(t) + C$_2$x(t-1) + B$_3$x(t-2) + O$_1$ |
| 8 | L | H | L | x(7) | x(8) | x(6) | A$_2$ | B$_1$ | C$_3$ | B$_1$x(t) + A$_2$x(t-1) + C$_3$x(t-2) + O$_2$ |
| 9 | L | L | H | x(7) | x(8) | x(9) | A$_3$ | B$_2$ | C$_1$ | C$_1$x(t) + B$_2$x(t-1) + A$_3$x(t-2) + O$_3$ |

Fig. 7

ANALOG ADAPTIVE FIR FILTER HAVING INDEPENDENT COEFFICIENT SETS FOR EACH FILTER TAP

CROSS REFERENCE TO RELATED APPLICATIONS

This application is related to and claims priority from U.S. provisional application 60/508,548, filed Oct. 2, 2003, entitled "Analog FIR" and hereby incorporated by reference.

FIELD OF THE INVENTION

This invention relates to analog finite impulse response (FIR) filters.

BACKGROUND

Filtering is a commonly performed operation in electronic circuitry, and has various applications such as reduction of out of band noise and reduction of interference. A finite impulse response (FIR) filter is a common type of filter, where the filter output is a weighted sum of time-delayed samples of the filter input. FIR filters are relatively simple to implement, especially in adaptive filtering systems where the filter transfer function (i.e., the weights) are controlled by a control loop. The control for adaptive filtering usually entails minimization of an error signal derived from the filter output.

FIG. 1 shows a common approach for implementing FIR filters. On FIG. 1, the filter input x(t) is provided to a delay line including delay elements 104, 106, 108, etc. in series. Each delay element introduces a time delay, so the output of delay element 104 is $x(t-T1)$, the output of delay element 106 is $x(t-T1-T2)$, and the output of delay element 108 is $x(t-T1-T2-T3)$, etc. Here T1, T2, and T3 are the delays introduced by delay elements 104, 106, and 108 respectively. In the usual case where T1=T2=T3=T, the outputs of elements 104, 106, and 108 are $x(t-T)$, $x(t-2T)$, and $x(t-3T)$ respectively. Coefficients 112, 114, and 116 (having values $C_1$, $C_2$, and $C_3$ respectively) are provided to multipliers 118, 120, and 122 respectively. Multipliers 120 and 122 receive inputs from delay elements 104 and 106 respectively, as shown. The outputs of multipliers 118, 120, and 122 are provided to a summing junction 124, which provides the sum of the multiplier outputs as a filter output y(t). In the example of FIG. 1, $y(t)=C_1x(t)+C_2x(t-T)+C_3x(t-2T)$, which shows that the filter of FIG. 1 is a FIR filter. FIR filters having this architecture are known as delay-line filters, since delay elements are connected in series to provide the various delays of the filter. It is convenient to define a tap as being a unit of an FIR filter, so in the example of FIG. 1, delay element 104, coefficient 114 and multiplier 120 together make up one of the filter taps. Three taps are shown on FIG. 1, but FIR filters can have any number of taps.

Although the delay-line approach of FIG. 1 is simple and commonly employed, it has disadvantages which are particularly noticeable for filters having a large number of taps. In particular, noise, offsets and other non-idealities tend to accumulate as a signal propagates in succession through a long series of delay elements. In order to alleviate this problem, some FIR filters are implemented with the track and hold architecture shown in FIG. 2. On FIG. 2, the filter input x(t) is provided to track and hold taps 202, 204, and 206. Track and hold taps 202, 204, and 206 provide corresponding outputs $Y_1$, $Y_2$, and $Y_3$ to multipliers 118, 120, and 122 respectively. Coefficients $C_1$, $C_2$ and $C_3$ are provided to a shuffler 208, which has outputs $X_1$, $X_2$, $X_3$. The shuffler outputs $X_1$, $X_2$ and $X_3$ are provided to multipliers 118, 120 and 122 respectively. The outputs of multipliers 118, 120, and 122 are received by summing junction 124 which provides the sum of the multiplier outputs as the filter output y(t).

The track and hold taps (i.e., taps 202, 204, and 206 on FIG. 2) have an output that remains constant except when the tap is triggered to set its output to a sample of the input x(t). These trigger inputs are shown on FIG. 2 as phases $\phi_1$, $\phi_2$, and $\phi_3$. The table of FIG. 3 shows operation of the filter of FIG. 2 over time. Column "t" of FIG. 3 shows time, from 1 to 9. Column "$\phi_1$" of FIG. 3 show the phase $\phi_1$ for tap 202. Tap 202 is periodically triggered at times 1, 4, 7, etc., and this triggering is indicated by "H" in column "$\phi_1$" of FIG. 3. Column "$Y_1$" of FIG. 3 shows the output $Y_1$ of tap 202, which remains constant except when triggered to be updated to the current x(t) value. Thus $Y_1$ (t) is as shown on FIG. 3. Similarly, columns "$\phi_2$" and "$\phi_3$" show phases $\phi_2$ and $\phi_3$ for taps 204 and 206 respectively. Thus tap 204 is periodically triggered at times 2, 5, 8, etc., and tap 206 is periodically triggered at times 3, 6, 9, etc, as indicated in these columns. Accordingly, the outputs $Y_2(t)$ and $Y_3(t)$ are as shown in columns "$Y_2$" and "$Y_3$" of FIG. 3. In this example, the phases of the three track and hold taps are evenly spaced in time, which is typical.

As a result of this system for tap triggering, the three tap outputs $Y_1$, $Y_2$, and Y3 at each time t include the current input x(t), a 1-unit delayed sample x(t−1) and a 2-unit delayed sample x(t−2). However, the correspondence between $Y_1$, $Y_2$, $Y_3$ and x(t), x(t−1) and x(t−2) is not fixed. Instead, this correspondence is a permutation which varies periodically in time. In order to provide a filter having a time-independent transfer function, shuffler 208 sets its outputs $X_1$, $X_2$, $X_3$ at each time to a corresponding permutation of its inputs $C_1$, $C_2$, $C_3$, as shown in the "$X_1$", "$X_2$" and "$X_3$" columns of FIG. 3. The rightmost column shows the filter output $(X_1Y_1+X_2Y_2+X_3Y_3)$ which is given by $C_1x(t)+C_2x(t-1)+C_3x(t-2)$. Thus the filter of FIG. 2 operating according to FIG. 3 is an FIR filter having a time-independent transfer function. The process of permuting the tap coefficients to provide a time-independent filter transfer function is referred to as tap weight rotation, and is applicable to filters having any number of taps.

There are various known methods for implementing shuffler 208. For example, switching can be used (e.g., in a crossbar switch) to relate $X_{1-3}$ to $C_{1-3}$. It is also possible to set up a delay line for the coefficients where inputs to the delay line cycle periodically through $C_1$, $C_2$, and $C_3$. By taking $X_1$, $X_2$, and $X_3$ from delay line outputs, the operation of shuffler 208 can be implemented. Such a coefficient delay line can be either an analog delay line or a digital delay line.

The FIR filter of FIG. 2 does not suffer from the problem of noise, offset and non-ideality accumulation in a delay line, since no delay line is present. FIR filters such as shown in FIG. 2 are known in the art. For example, U.S. Pat. No. 5,931,898 considers filters of this type, as does U.S. Pat. No. 5,563,819. However, the FIR filter of FIG. 2 suffers from certain problems which are not considered in these references. More specifically, the filter of FIG. 2 should ideally compute a tap term such as $C_2x(t-1)$ in a manner that is not affected by tap weight rotation. However, physical components used to implement filters are not perfectly ideal, and as a result of multiplier gain variations and/or component offsets, the computed result for a term such as $C_2x(t-1)$ will typically be affected by tap weight rotation. For example, this term is provided by tap 204 and multiplier 120 on FIG.

2 at times 3, 6, 9, etc., is provided by tap 206 and multiplier 122 at times 4, 7, etc., and is provided by tap 202 and multiplier 118 at times 5, 8, etc. Unless these taps and multipliers are perfectly identical, the tap weight rotation will lead to an undesirable time-variation of the computed result corresponding to $C_2x(t-1)$.

Accordingly, it would be an advance in the art to provide a finite impulse response filter having tap weight rotation that can compensate for non-identical components.

SUMMARY

The present invention provides a finite impulse response filter having tap weight rotation, where each tap has a corresponding coefficient selector. Each coefficient selector includes N coefficients, where N is the number of taps. Each coefficient selector provides one of its corresponding coefficients as an input to a multiplier. Each multiplier also receives an input from a triggered track and hold tap. The tap coefficients are selected according to the time delay since the corresponding track and hold tap was most recently triggered. In this manner, the tendency of multiplier gain nonuniformity to degrade filter operation in the presence of tap weight rotation is reduced. In another embodiment, an offset selector is provided, to reduce the tendency of component offsets to degrade filter operation in the presence of tap weight rotation.

BRIEF DESCRIPTION OF THE DRAWINGS

FIG. 5 is a table showing operation of the filter of FIG. 4.

FIG. 7 is a table showing operation of the filter of FIG. 6.

DETAILED DESCRIPTION

Figure 1:
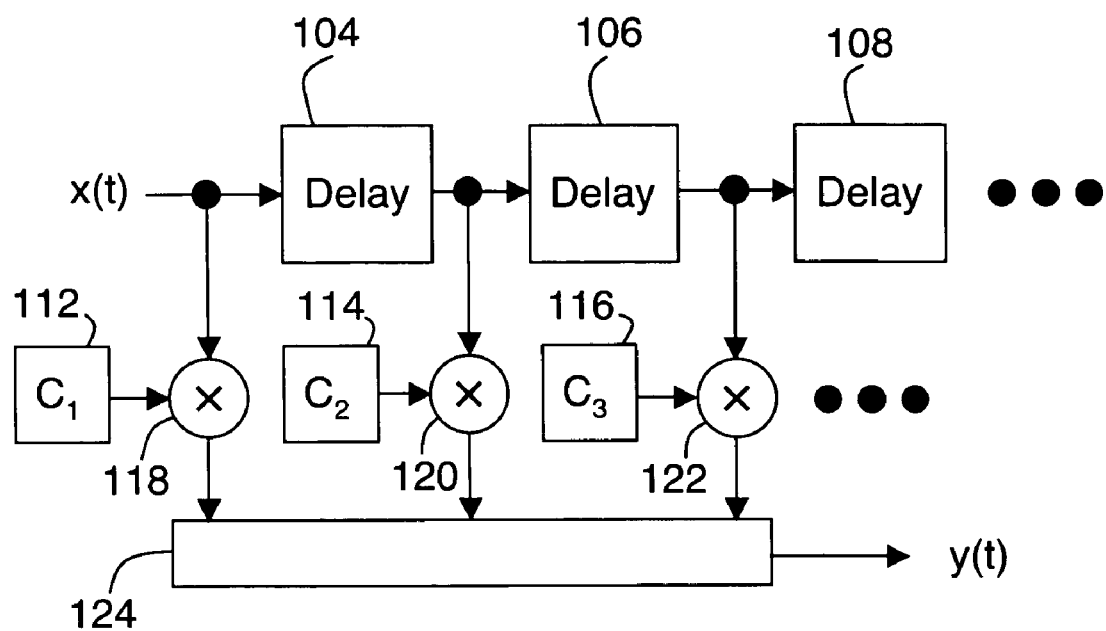
FIG. 1 shows a prior art delay-line FIR filter.
Figures 2, 3:
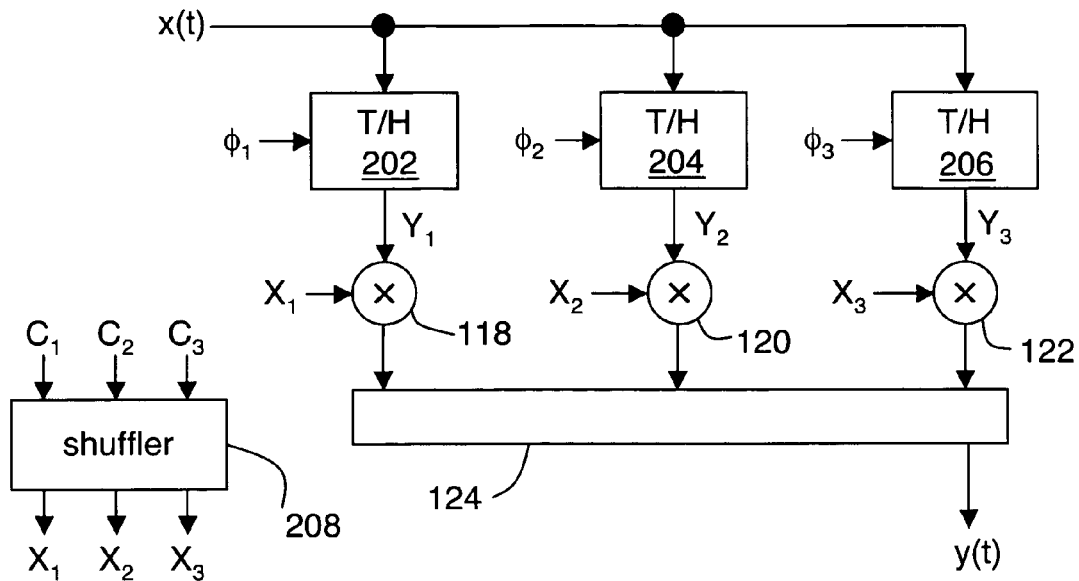
FIG. 2 shows a prior art FIR filter having tap weight rotation.
FIG. 3 is a table showing operation of the filter of FIG. 2.
Figure 4:
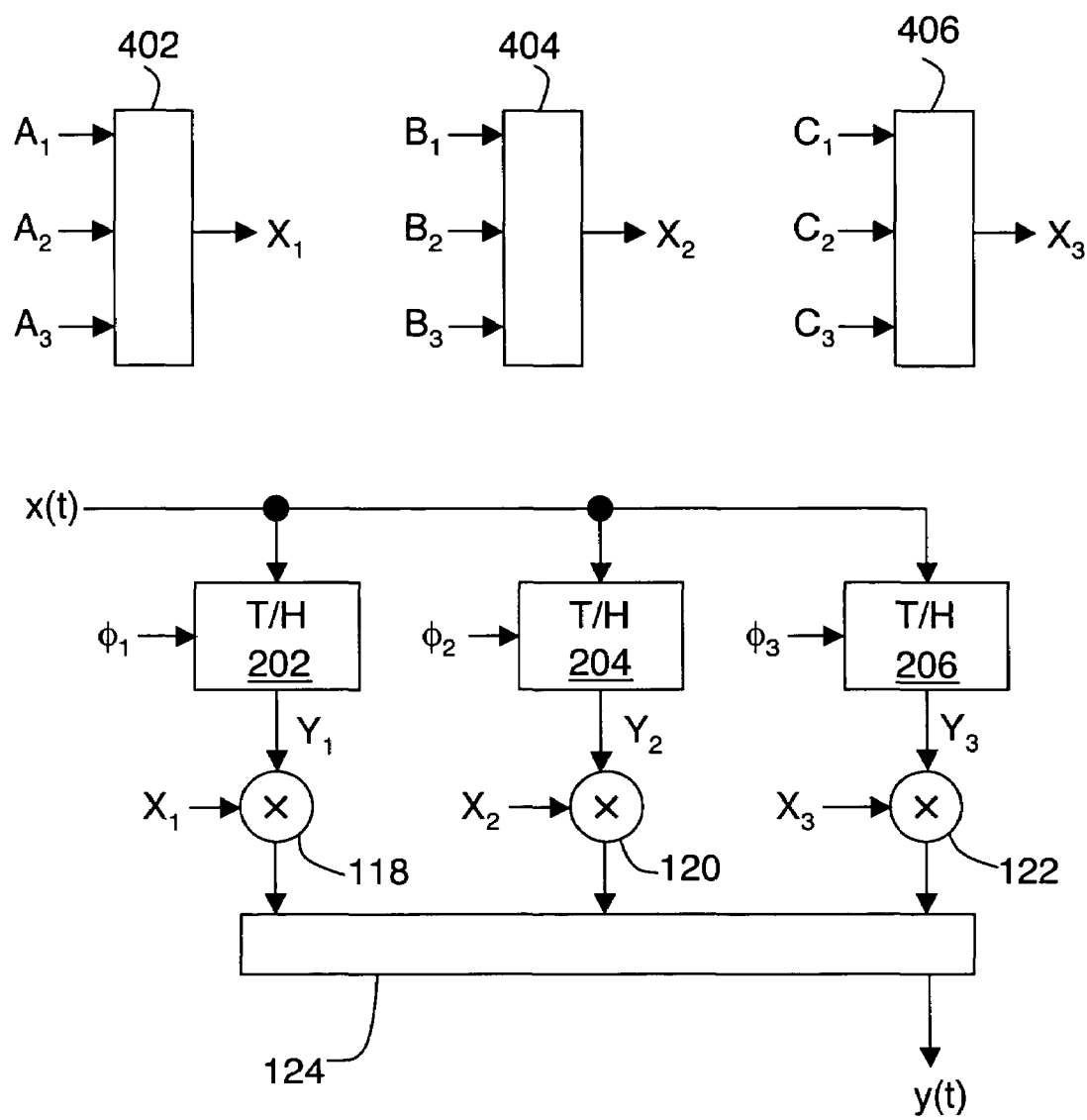
FIG. 4 shows a FIR filter having tap weight rotation according to an embodiment of the invention.

FIG. 4 shows an analog finite impulse response (FIR) filter having tap weight rotation according to an embodiment of the invention. On FIG. 4, the multiplier inputs $X_1$, $X_2$, and $X_3$ are supplied by coefficient selectors 402, 404 and 406 respectively. Each coefficient selector includes N tap coefficients (where N is the number of filter taps). In this example N=3, but N can be any number greater than or equal to 2. Coefficient selector 402 includes tap coefficients $A_1$, $A_2$, $A_3$. Similarly, coefficient selectors 404 and 406 include tap coefficients $B_1$, $B_2$, $B_3$ and $C_1$, $C_2$, $C_3$, respectively. Coefficient selector 402 provides as its output $X_1$ one of its tap coefficients (i.e., $A_1$, $A_2$, or $A_3$). Similarly, $X_2$ is selected to be one of $B_1$, $B_2$, $B_3$ by selector 404 and $X_3$ is selected to be one of $C_1$, $C_2$, $C_3$ by selector 406. Thus the filter of FIG. 4 has an independent set of tap coefficients for each tap, unlike the filter of FIG. 2 which has a common set of tap coefficients for all taps.

Typically, the filter of FIG. 4 has an analog signal path (i.e., track and hold taps 202, 204, and 206, multipliers 118, 120, and 122 and summing junction 124 are typically analog). The coefficients $A_{1-3}$, $B_{1-3}$, and $C_{1-3}$ can be realized as either analog values or as digital values. For example, if the coefficients are realized as analog signal values, coefficient selectors 402, 404, and 406 can be analog multiplexers (or switches). If the coefficients are realized as digital signal values, then coefficient selectors 402, 404, and 406 can be either analog or digital, depending on the location of the digital to analog converter (DAC) used for interfacing to the analog multipliers. If the coefficient selectors are digital, than a DAC (not shown on FIG. 4) is required between the coefficient selectors and the multipliers. Alternatively, digital coefficient values can be converted to analog values prior to being input to analog coefficient selectors. It is also possible to implement multipliers 118, 120, and 122 with multiplying DACs, where the port receiving the output of a track and hold tap is an analog input port, and the port receiving the output of a coefficient selector is a digital input port.

FIG. 5 shows the operation of the filter of FIG. 4. The triggering of track and hold taps 202, 204, and 206 is as discussed in connection with FIGS. 2 and 3. The coefficients selected by selectors 402, 404 and 406 are generally selected according to the time delay since the corresponding track and hold tap was most recently triggered. In the example given here, $X_1$ is set to $A_1$ if tap 202 is currently triggered, $X_1$ is set to $A_2$ if tap 202 was most recently triggered 1 time unit ago, and $X_1$ is set to $A_3$ if tap 202 was most recently triggered 2 time units ago. Similarly, $X_2$ is set to $B_1$ if tap 204 is currently triggered, $X_2$ is set to $B_2$ if tap 204 was most recently triggered 1 time unit ago, and $X_2$ is set to $B_3$ if tap 204 was most recently triggered 2 time units ago. Following the same pattern, $X_3$ is set to $C_1$ if tap 206 is currently triggered, $X_3$ is set to $C_2$ if tap 206 was most recently triggered 1 time unit ago, and $X_3$ is set to $C_3$ if tap 206 was most recently triggered 2 time units ago.

Thus, as indicated in the rightmost column of FIG. 5, the filter output is given by $C_1x(t)+B_2x(t-1)+A_3x(t-2)$ or by $A_1x(t)+C_2x(t-1)+B_3x(t-2)$ or by $B_1x(t)+A_2x(t-1)+C_3x(t-2)$, depending on the time t. The filter transfer function will be substantially time-independent if $A_1$, $B_1$, and $C_1$ are substantially equal to each other, and $A_2$, $B_2$, and $C_2$ are substantially equal to each other, and $A_3$, $B_3$, and $C_3$ are substantially equal to each other. An alternative way of describing this situation is to regard each coefficient selector as implementing a mathematical function c(T), where c is a tap coefficient value and T is a time delay. If this function c(T) is the same for each coefficient selector, then the filter transfer function is time-independent.

A noteworthy feature of the present invention is that the extra degrees of freedom provided by maintaining separate values of $A_1$, $B_1$, and $C_1$ (and similarly for the other coefficients) enable compensation of component nonidealities. For example, suppose multipliers 118, 120 and 122 have non-ideal gains G equal to 0.99, 1.01 and 1.02 respectively, where the multiplier output for inputs x and y is Gxy. Thus G=1 would be an ideal multiplier. Compensation of the non-ideal gain of multipliers 118, 120 and 122 can be provided by setting $1.02C_1=0.99A_1=1.01B_1$, $1.02C_2=0.99A_2=1.01B_2$, and $1.02C_3=0.99A_3=1.01B_3$. In this manner, the effect of tap weight rotation combined with non-identical multiplier gain on the filter transfer function is removed.

Setting the $N^2$ tap coefficients to provide such compensation can be done manually (e.g., by measuring the multiplier gains and adjusting the coefficients accordingly), but is preferably accomplished automatically within an adaptive filter control loop. In general terms, an adaptive filter control loop controls filter parameters (here these parameters are the $N^2$ tap coefficients) to minimize an error signal derived from the filter output. The error signal to use depends on the application of the adaptive filter, which can include interference cancellation and decision feedback equalization. Adaptive filter control loops are typically designed to track relatively slow changes. In particular, changes tracked by an adaptive filter control loop are much slower than the rate of tap rotation.

Thus when the filter of FIG. 4 is placed within an adaptive control loop, the loop will act to keep the filter transfer function constant on the time scale of the tap rotation. More specifically, the $N^2$ tap coefficients will end up having relations between them that tend to make the transfer function independent of tap rotation. For example, if the multiplier gains are as in the above example, operation of an adaptive control loop will lead to the above-given compensating relations between the tap coefficients. Naturally, it is important in such adaptive filtering to rotate the adaptive control to correspond to the tap rotation. For example, at times 3, 6, 9, . . . on FIG. 5, the relevant coefficients are $A_3$, $B_2$ and $C_1$, and these are the coefficients to control responsive to the error signal. At times 4, 7, . . . on FIG. 5, the coefficients to control are $A_1$, $B_3$, and $C_2$, and at times 5, 8, . . . , the coefficients to control are $A_2$, $B_1$, and $C_3$. Convergence of such an adaptive filter is preferably facilitated by initializing the filter such that each coefficient selector provides the same functional dependence of selected tap coefficient value on time delay. This preferred initialization provides a filter initial state having a transfer function independent of tap weight rotation, which reduces the time required for convergence.

If the filter coefficients are adaptively updated according to the least mean square (LMS) method, the updating equation is given by $$a(n+1)=a(n)+u*W(n)*e(n)$$

where a is the coefficient value, u is a gain constant, W(n) is the corresponding state variable (e.g., $X_1Y_1$ on FIG. 4), and $e(n)=y(n)-d(n)$ is the error signal. Here y(n) is the filter output and d(n) is the desired output. As indicated above, during adaptation the coefficients being updated are rotated along with the coefficients being used. In practice, due to time delays, coefficients will typically be updated at times when other coefficients are in use, so information required for coefficient updating is preserved as long as necessary to complete the update. For example, at t=4 on FIG. 5, coefficients $A_1$, $B_3$ and $C_2$ are relevant. Updates to these coefficients for this example are calculated according to:

$$A_1(7)=A_1(4)+Y_1(4)*A_1(4)*e(4)*u,$$

$$B_3(7)=B_3(4)+Y_2(4)*B_3(4)*e(4)*u,$$

$$C_2(7)=C_2(4)+Y_3(4)*C_2(4)*e(4)*u.$$

Note that this updating can be done at any time after t=4 and on or before t=7, since values for these coefficients are not needed at times t=5 and t=6 (due to tap weight rotation). However, to compute these updates, values for e(4) and $Y_{1-3}(4)$ are required. Thus, these values must be preserved for the updating calculation as needed (e.g., if this updating is performed on or after t=5).

Figure 6:
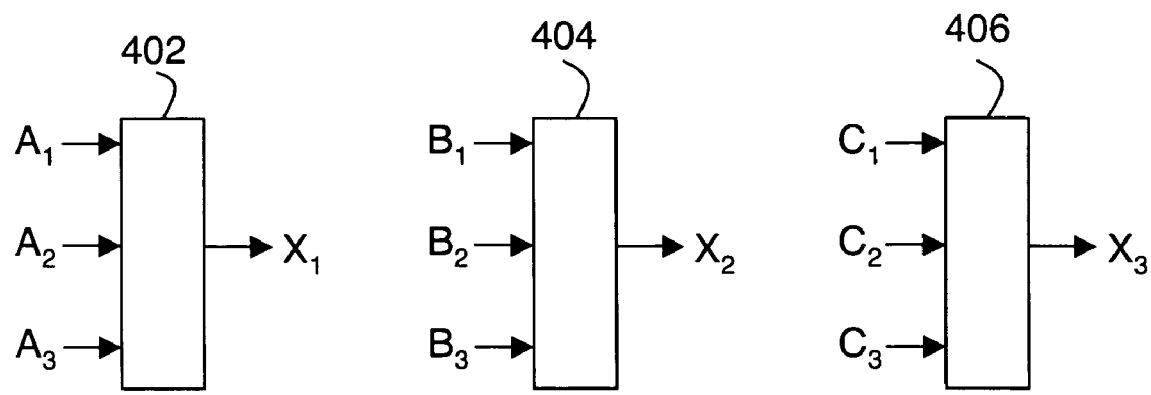
FIG. 6 shows a FIR filter having tap weight rotation according to another embodiment of the invention.
Figure 6:
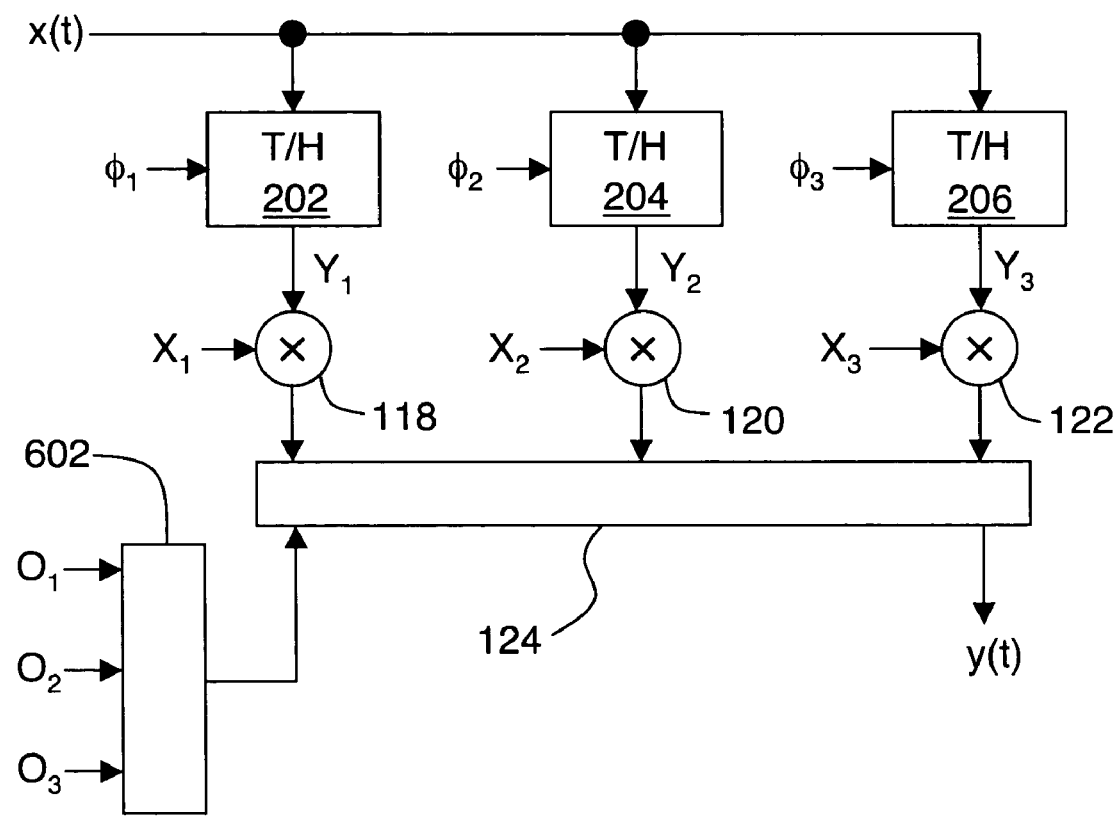

FIG. 6 shows an alternative embodiment of the invention that is similar to the embodiment of FIG. 4 except for the addition of an offset selector 602 providing an output to summing junction 124. Offset selector 602 in this example includes three offsets $O_1$, $O_2$, and $O_3$, and selects one of these three offsets as its output according to which of taps 202, 204 and 206 was most recently triggered.

FIG. 7 shows operation of the filter of FIG. 6, and is similar to FIG. 5 except for addition of one of offsets $O_1$, $O_2$, or $O_3$ to the filter output. As indicated above, the selection of which offset is selected by offset selector 602 is based on which tap was most recently triggered. In this example, offset $O_1$ is selected when tap 202 is most recently triggered (i.e., at times 4, 7, . . . ), offset $O_2$ is selected when tap 204 is most recently triggered (i.e., at times 5, 8, . . . ), and offset $O_3$ is selected when tap 206 is most recently triggered (i.e., at times 3, 6, 9, . . . ).

The main purpose of adding offset selector 602 to the embodiment of FIG. 6 is to compensate for variations in component offsets in much the same way as component gain variations are compensated by coefficient selectors 402, 404, and 406. In general terms, if an ideal multiplier has an output given by G*C*x, where C and x are the inputs and G is the multiplier gain, then a multiplier having offsets has an output given by y=G*(C+dC)*(x+dx)+dy, where dC is the input coefficient offset, dx is the input signal offset and dy is the multiplier output offset. Note that in the embodiment of FIG. 6, any output offsets provided by taps 202, 204, and 206 are included without loss of generality into input signal offset dx.

The multiplier output can be expressed as y≈G*C*x+ G*dC*x+G*C*dx+dy, where the product dC*dx is neglected because offsets dC and dx are assumed to be small (i.e., dC<<C and dx<<x). In this expression, the G*C*x term is the desired product term. The G*dC*x term is proportional to x, and therefore is equivalent to a perturbation to the gain G of multiplier. As a result, the effect of this term can be compensated for by coefficient selectors 402, 404, and 406 as discussed above. The dy term is simply a fixed output offset, which is not of concern, since it does not vary as the tap weights are rotated. The remaining term, G*C*dx is a multiplier output offset that depends on C, and will therefore change as the tap weights are rotated (i.e., as C changes). The purpose of providing offset selector 602 is to compensate for such offset variation.

More specifically, each multiplier in a filter such as on FIG. 6 can have a coefficient-dependent output offset (i.e., a G*C*dx term as above), so the net offset provided to summing junction 124 by all the multipliers depends on the tap weight rotation (i.e., on which tap was most recently triggered). Thus, provision of a compensating offset selected according to which tap was most recently triggered (e.g., $O_1$, $O_2$, or $O_3$) can substantially eliminate the variation in the output y(t) due to the combination of variable component offsets with tap weight rotation.

The values for the offsets $O_1$, $O_2$, and $O_3$ to provide such compensation can either be selected manually, or can be provided automatically by operation of an adaptive filter control loop. The principles involved are the same as considered above in connection with selection of $A_{1-3}$, $B_{1-3}$ and $C_{1-3}$.

What is claimed is:

1. An analog finite impulse response filter having a filter input and a filter output, the filter comprising:
   a set of N≧2 multipliers, each having first and second multiplier inputs and providing a corresponding multiplier output;
   a set of N track and hold taps in one to one correspondence with said set of multipliers, each of said taps receiving said filter input and providing a tap output that remains constant except when said tap is triggered to set said tap output to a sample of said filter input, wherein said tap output is provided as said first input of said corresponding multiplier;
   a set of N coefficient selectors in one to one correspondence with said set of multipliers, each of said coefficient selectors including N tap coefficients and providing a selected one of said tap coefficients to said second input of said corresponding multiplier, wherein said selected tap coefficient is selected according to a time delay since said corresponding tap was most recently triggered; and a summing junction receiving all of said multiplier outputs and providing their sum as said filter output.

2. The filter of claim 1, wherein each of said taps is periodically triggered according to a corresponding tap phase, and wherein said tap phases are evenly spaced.

3. The filter of claim 1, wherein a transfer function relating said filter output to said filter input is substantially time-independent.

4. The filter of claim 1, wherein each of said coefficient selectors provides substantially the same functional dependence of selected tap coefficient value on said time delay.

5. The filter of claim 1, further comprising an offset selector including N offsets and providing a selected one of said offsets as an input to said summing junction, wherein said selected offset is selected according to which tap was most recently triggered.

6. The filter of claim 5, wherein said multipliers provide a net parasitic offset to said summing junction, and wherein said selected offset substantially cancels said net parasitic offset.

7. The filter of claim 1, further comprising a filter control loop responsive to said filter output and controlling all $N^2$ of said tap coefficients to minimize an error signal derived in part from said filter output.

8. The filter of claim 7, wherein a transfer function relating said filter output to said filter input is adaptively controlled to minimize said error signal.

9. The filter of claim 7, wherein each of said coefficient selectors is initialized to provide substantially the same functional dependence of selected tap coefficient value on said time delay.

10. A method for analog finite impulse response filtering of a filter input, the method comprising:

providing a set of $N \geq 2$ samples of said filter input, wherein each of said samples remains constant in time except when triggered to be set to a current sample of said filter input;

providing a set of N coefficient arrays in one to one correspondence with said samples, each of said arrays having N coefficients;

selecting from each of said coefficient arrays a selected coefficient according to a time delay since said corresponding sample was most recently triggered;

calculating a product of said selected coefficient with said corresponding sample for each of said samples; and calculating a sum of said products and providing said sum as a filter output.

11. The method of claim 10, wherein each of said samples is periodically triggered according to a corresponding sample phase, and wherein said sample phases are evenly spaced.

12. The method of claim 10, wherein a transfer function relating said filter output to said filter input is substantially time-independent.

13. The method of claim 10, wherein a value of each of said selected coefficients has substantially the same functional dependence on said time delay.

14. The method of claim 10, further comprising providing a set of N offsets and adding a selected one of said offsets to said sum, wherein said selected offset is selected according to which sample was most recently triggered.

15. The method of claim 14, wherein said selected offset substantially cancels a net parasitic offset in said sum.

16. The method of claim 10, further comprising providing a filter control loop responsive to said filter output and controlling all $N^2$ of said coefficients to minimize an error signal derived in part from said filter output.

17. The method of claim 16, wherein a transfer function relating said filter output to said filter input is adaptively controlled to minimize said error signal.

18. The method of claim 16, wherein each of said coefficient arrays is initialized to provide substantially the same functional dependence of selected coefficient value on said time delay.

* * * * *